(12) United States Patent
Barbier

(10) Patent No.: US 8,921,753 B2
(45) Date of Patent: Dec. 30, 2014

(54) IMAGE SENSOR WITH INDIVIDUALLY SELECTABLE IMAGING ELEMENTS

(75) Inventor: Frederic Barbier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 292 days.

(21) Appl. No.: 13/456,643

(22) Filed: Apr. 26, 2012

(65) Prior Publication Data

US 2013/0105664 A1    May 2, 2013

(30) Foreign Application Priority Data

Oct. 26, 2011  (FR) ...................... 11 59727

(51) Int. Cl.
| | | |
|---|---|---|
| *G01B 9/04* | (2006.01) | |
| *H01L 27/146* | (2006.01) | |
| *H04N 5/361* | (2011.01) | |
| *H04N 5/353* | (2011.01) | |

(52) U.S. Cl.
CPC .......... *H01L 27/14609* (2013.01); *H04N 5/361* (2013.01); *H04N 5/3535* (2013.01); *H01L 27/14645* (2013.01)
USPC .................................. 250/208.1

(58) Field of Classification Search
USPC ........ 250/208.1; 257/230, 291–293; 348/241, 348/243, 294, 302, 308
See application file for complete search history.

(56) References Cited

U.S. PATENT DOCUMENTS

| | | | |
|---|---|---|---|
| 7,518,168 B2 | 4/2009 | Mabuchi et al. | |
| 7,969,490 B2 | 6/2011 | Bock | |
| 2003/0112350 A1 | 6/2003 | Suzuki et al. | |
| 2007/0013797 A1* | 1/2007 | McKee | 348/308 |
| 2008/0197269 A1 | 8/2008 | Hagihara | |
| 2009/0302359 A1 | 12/2009 | Chen | |

FOREIGN PATENT DOCUMENTS

| | | |
|---|---|---|
| EP | 1622359 | 2/2006 |
| WO | 2011/096207 | 8/2011 |

* cited by examiner

*Primary Examiner* — Thanh Luu
*Assistant Examiner* — Renee D Chavez
(74) *Attorney, Agent, or Firm* — Allen, Dyer, Doppelt, Milbrath & Gilchrist, P.A.

(57) ABSTRACT

An imaging element includes a photosensor and a transfer transistor to transfer electrical charges from the photosensor to a charge accumulation node. A selector is configured to receive at least two logic selection signals and to supply an activation signal, which is a function of the selection signals, to a control terminal of the transfer transistor. The selector is configured to receive at least two selection signals, each having a positive voltage when it is at a logic value 1 and a negative voltage when it is a logic value 0, and to supply the activation signal having a negative voltage when the imaging element is not selected.

15 Claims, 3 Drawing Sheets

IMAGE SENSOR WITH INDIVIDUALLY SELECTABLE IMAGING ELEMENTS

FIELD OF THE INVENTION

The present invention relates to an imaging element, and an image sensor comprising a plurality of imaging elements. The present invention also relates to a method of controlling an imaging element.

BACKGROUND OF THE INVENTION

An image sensor generally comprises a semiconductor substrate and an array of imaging elements arranged in horizontal rows and vertical columns. FIG. 1 shows a single imaging element U comprising a pixel P. The pixel comprises a photosensor PS, a transfer transistor TT, a reset transistor RT, a source-follower transistor FT, and an output transistor OT.

The photosensor PS has an anode connected to ground and a cathode coupled to a charge node N1 through the transfer transistor TT. The transfer transistor TT has a source S connected to the photosensor PS, a drain D connected to node N1, and a gate G driven by an activation signal SL. The reset transistor RT has a drain D receiving a supply voltage VS, a source connected to node N1, and a gate G driven by a pixel reset signal PR. The source-follower transistor FT has a gate G driven by node N1, a drain D receiving a supply voltage VS, and a source S connected to the drain D of the output transistor OT. The output transistor OT has a gate G driven by a row readout signal RR, and a source S connected to an output OUT of the pixel.

For each pixel, an image capture cycle comprises a reset phase, a charge accumulation phase, a charge transfer phase, and a signal read phase. During the reset phase, the transfer transistor TT is set in a conducting state, and couples the photosensor PS to node N1. Any charges accumulated in the photosensor since the last image capture cycle are transferred to node N1.

During the charge accumulation phase, the transfer transistor TT is set in a blocked state to isolate the photosensor PS. The pixel is exposed to an incident light, and electrical charges are generated in the photosensor PS. During this time, a voltage V1 at node N1 is first charged to the supply voltage via the reset transistor RT, then the node is isolated by setting the transistor RT in the blocked state. Voltage V1 drops to a reset voltage, which is sensed by the source-follower transistor FT and supplied via the output transistor OT to an image processing system (not shown), for storage.

During the charge transfer phase, the transfer transistor TT is again set in the conducting state, and charges accumulated in the photosensor PS are transferred to node N1. Voltage V1 goes to a signal read voltage depending on the amount of charges accumulated.

During the signal read phase, the source-follower transistor FT senses the signal read voltage and supplies it to the image processing system via the output transistor OT. In a process known as Correlated Double Sampling, the difference between the reset voltage and the signal read voltage is the voltage value of the imaging element, corresponding to the amount of incident light detected. This process advantageously removes noise known as 'kTC' noise.

In general, the pixel reset signal PR, the activation signal SL, and the row readout signal RR are supplied to all pixels belonging to the same row. However, an image may have a large contrast between its dark and bright areas. For optimum image reconstruction, the pixels or group of pixels corresponding to dark areas of the image should have longer charge accumulation times, and the pixels or groups of pixels corresponding to bright areas should have shorter charge accumulation times.

To this end, U.S. Pat. No. 7,969,490 discloses the provision, in each imaging element U, of a selection transistor ST associated with a pixel P as shown in FIG. 1. The selection transistor ST has a drain D receiving a column selection signal Sy, a gate G driven by a row selection signal Sx, and a source S supplying the activation signal SL to the gate G of the transfer transistor TT.

When the row selection signal Sx and the column selection signal Sy are both at logic 1, corresponding to positive voltages, the activation signal SL is driven to a positive voltage value. The transistor TT is set in the conducting state. Otherwise, if the row and/or column selection signals Sx, Sy are at logic 0, the transfer transistor TT remains set in the blocked state.

During an image capture cycle, all pixels of a row begin the charge accumulation period at the same time. Certain pixels of the row are then individually reset at later times to re-start their charge accumulation periods for shorter times. The contrast of the image may therefore be adjusted on an individual pixel basis. The charge accumulation phase then ends at the same time for all pixels of the row.

Another phenomenon that may affect the image quality is known as "dark current." Dark current is a current generated in the photosensor even when no incident light is received. It is known that dark current can be reduced by applying a negative voltage to the gate of the transfer transistor TT during the charge accumulation phase. In this manner, electrons that would normally contribute to the dark current recombine with holes and are neutralized. Nevertheless, the imaging element of FIG. 1 does not allow the application of a negative voltage to the gate of the transfer transistor TT.

U.S. Pat. No. 7,518,168 discloses a way to apply a negative voltage to the gates of all the transfer transistors TT of all imaging elements of a row. However, this patent does not disclose an individual selection of the imaging elements, whereas U.S. Pat. No. 7,969,490 does not provide dark current prevention.

SUMMARY OF THE INVENTION

An object of the present invention is to provide an imaging element that is both individually selectable and with reduced dark current.

This and other objects, advantages and features of the present invention are provided by an imaging element comprising a photosensor and a transfer transistor to transfer electrical charges from the photosensor to a charge accumulation node. Selection means or a selection circuit may be configured to receive at least two logic selection signals and to supply an activation signal, which is a function of the selection signals, to a control terminal of the transfer transistor. The selection circuit may be configured to receive at least two selection signals each having a positive voltage when it is at the logic value 1 and a negative voltage when it is at the logic value 0, and to supply the activation signal having a negative voltage when the imaging element is not selected.

In one embodiment, the selection circuit may only comprise four P-type MOS transistors and be configured to receive first and second selection signals having positive voltage and negative voltage values according to their logic values, and first and second inverted selection signals having positive voltage and negative voltage values according to their logic values.

In another embodiment, the selection circuit may only comprise three P-type MOS transistors and be configured to receive first and second selection signals having positive voltage and negative voltage values according to their logic values, and a first inverted selection signal having a low voltage value and a high voltage value according to its logic value.

In another embodiment, the selection circuit may only comprise two P-type MOS and two N-type MOS transistors and be configured to receive first and second inverted selection signals having positive voltage and negative voltage values according to their logic values.

In yet another embodiment, the selection circuit may only comprise two P-type MOS and one N-type MOS transistors, and be configured to receive first and second selection signals having positive voltage and negative voltage values according to their logic values.

Another aspect of the invention is directed to an image sensor device comprising a plurality of imaging elements arranged in horizontal rows and vertical columns, with each imaging element comprising a photosensor and a transfer transistor to transfer electrical charges from the photosensor to a charge accumulation node. Selection means or a selection circuit may be configured to supply an activation signal, which is a function of selection signals, to a control terminal of the transfer transistor. A row decoder may be coupled to each horizontal row of imaging elements and be configured to supply at least one logic selection signal to the selection circuit. A column decoder may be coupled to each vertical column of the imaging elements and be configured to supply at least one logic selection signal to the selection circuit. The row and column decoders may each be configured to supply to the selection circuit at least one logic select signal having a positive voltage when it is at the logic value 1 and a negative voltage when it is at the logic value 0. The selection circuit may be configured to supply the activation signal having a negative voltage when the imaging elements are not selected.

In one embodiment, the selection circuit may only comprise four P-type MOS transistors, and the row and column decoders may be configured to supply first and second selection signals having positive voltage and negative voltage values according to their logic values, and first and second inverted selection signals having positive voltage and negative voltage values according to their logic values.

In another embodiment, the selection circuit may only comprises three P-type MOS transistors, and the row and column decoders may be configured to supply first and second selection signals having positive voltage and negative voltage values according to their logic values, and a first inverted selection signal having a low voltage value and a high voltage value according to its logic value.

In another embodiment, the selection circuit may only comprise two P-type MOS and two N-type MOS transistors, and the row and column decoders may be configured to supply first and second inverted selection signals having positive voltage and negative voltage values according to their logic values.

In yet another embodiment, the selection circuit may only comprise two P-type MOS and one N-type MOS transistors, and the row and column decoders may be configured to supply first and second selection signals having positive voltage and negative voltage values according to their logic values.

Another aspect of the invention is directed to a method of controlling an imaging element comprising a photosensor and a transfer transistor to transfer electrical charges from the photosensor to a charge accumulation node, and selection means or a selection circuit to supply to a control terminal of the transfer transistor an activation signal which is a function of at least two logic selection signals. The method may comprise applying to the selection circuit at least two selection signals having a positive voltage when it is at the logic value 1 and a negative voltage when it is at the logic value 0, and supplying to the control terminal of the transfer transistor, through the selection circuit, an activation signal having a negative voltage when the imaging element is not selected.

In one embodiment, the selection circuit may only comprise four P-type MOS transistors, and the method may comprise applying to the selection circuit first and second selection signals having positive voltage and negative voltage values according to their logic values, and first and second inverted selection signals having positive voltage and negative voltage values according to their logic values.

In another embodiment, the selection circuit may only comprise three P-type MOS transistors, and the method may comprise applying to the selection circuit first and second selection signals having positive voltage and negative voltage values according to their logic values, and a first inverted selection signal having a low voltage value and a high voltage value according to its logic value.

In another embodiment, the selection circuit may only comprise two P-type MOS and two N-type MOS transistors, and the method may comprise applying to the selection circuit first and second inverted selection signals having positive voltage and negative voltage values according to their logic values.

In yet another embodiment, the selection circuit may only comprise two P-type MOS and one N-type MOS transistors, and the method may comprise applying to the selection circuit first and second selection signals having positive voltage and negative voltage values according to their logic values.

DETAILED DESCRIPTION OF THE DRAWINGS

Embodiments of the present invention will now be described in connection with, but not limited to, the appended drawings in which:

FIG. 1, previously described, shows a conventional imaging element according to the prior art;

DETAILED DESCRIPTION OF THE PREFERRED EMBODIMENTS

Figure 1:
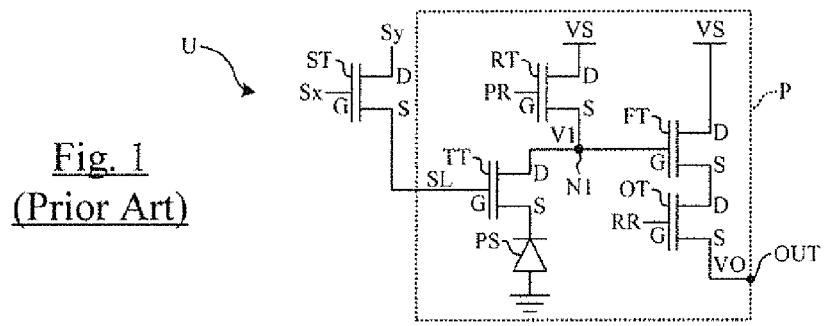
Figure 2:
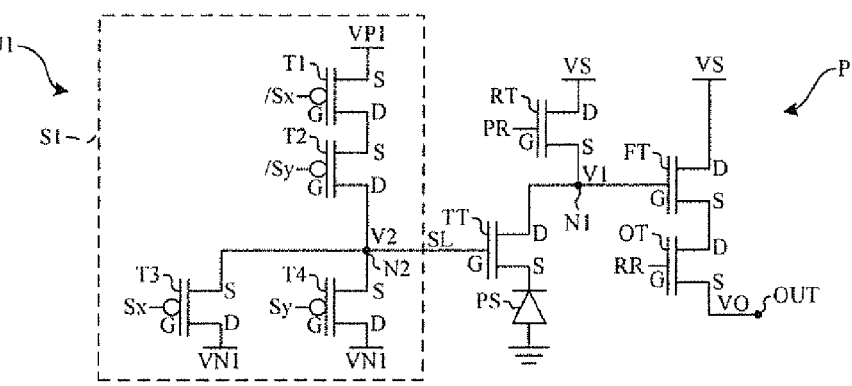
FIG. 2 shows an imaging element according to one embodiment of the invention.

FIG. 2 shows one embodiment of an imaging element U1 comprising a pixel P and a selection circuit S1 supplying a pixel activation signal SL to the pixel. The pixel P comprises a photosensor PS, a transfer transistor TT, a reset transistor RT, a source-follower transistor FT, and an output transistor OT.

The photosensor PS has an anode connected to ground and a cathode coupled to a charge node N1 through the transfer transistor TT. The transfer transistor TT has a source S connected to photosensor PS, a drain D connected to the charge node N1, and a gate G driven by an activation signal SL supplied on a control node N2 of the selection circuit S1. The reset transistor RT has a drain D receiving a supply voltage VS, a source connected to the charge node N1, and a gate G driven by a pixel reset signal PR. The source-follower transistor FT has a gate G driven by the charge node N1, a drain D receiving the supply voltage VS, and a source S connected to the drain D of the output transistor OT. The output transistor OT has a gate G driven by a row read signal RR, and a source S connected to an output OUT of the pixel.

The selection circuit S1 comprises four P-type MOS (PMOS) transistors T1, T2, T3, T4. Transistors T1, T2 are connected in series and transistors T3, T4 are connected in parallel. Transistor T1 has a source S receiving a positive voltage VP1, a gate G driven by an inverted row selection signal /Sx, and a drain D connected to a source S of transistor T2. Transistor T2 has a gate G driven by an inverted column selection signal /Sy, and a drain D connected to a control node N2. Node N2 is therefore connected to the gate of the transfer transistor TT and forms the output of the selection circuit S1. Transistors T3, T4 each have a drain D receiving a negative voltage VN1, a source S connected to the control node N2, and a gate driven by a row selection signal Sx and a column selection signal Sy, respectively.

TABLE 1A below shows example voltage values corresponding to logic 0 and logic 1 of signals Sx, Sy, /Sx, /Sy, SL and the voltage values of activation signal SL. TABLE 1B shows the truth table for the possible logic combinations of the row and column selection signals.

TABLE 1A

|   | Sx  | Sy  | /Sx | /Sy | SL  |
|---|-----|-----|-----|-----|-----|
| 0 | VN2 | VN2 | VN2 | VN2 | VN1 |
| 1 | VP1 | VP1 | VP1 | VP1 | VP1 |

TABLE 1B

| Sx | Sy | /Sx | /Sy | SL | SL (Voltage) |
|----|----|-----|-----|----|--------------|
| 0  | 0  | 1   | 1   | 0  | VN1          |
| 0  | 1  | 1   | 0   | 0  | VN1          |
| 1  | 0  | 0   | 1   | 0  | VN1          |
| 1  | 1  | 0   | 0   | 1  | VP1          |

As may be seen in the above table, the selection signals Sx, Sy, /Sx, /Sy vary between a negative voltage value VN2 and a positive voltage value VP1. As an example, negative voltage VN1 is equal to −0.8V, negative voltage VN2 is equal to −1.6V, and positive voltage VP1 is equal to +3.3V. Thus, when the row selection signal Sx and/or the column selection signal Sy are at logic 0, the activation signal SL is at logic 0. Negative voltage VN1 is supplied by the selection circuit S1, and the imaging element is set in the non-selected state. The transfer transistor TT receives negative voltage VN1 on its gate G, is set in a blocked state, and dark current is prevented.

When the row selection Sx and column selection Sy signals are both at logic 1, transistors T1, T2 couple the control node N2 to positive voltage VP1, while transistors T3, T4 prevent the control node N2 from being coupled to negative voltage VN1. The activation signal SL is at a logic 1, and the imaging element is set in the selected state. Positive voltage VP1 is supplied by the selection circuit S1. The transfer transistor TT receives positive voltage VP1 on its gate G and is set in a conducting state.

Figure 3:
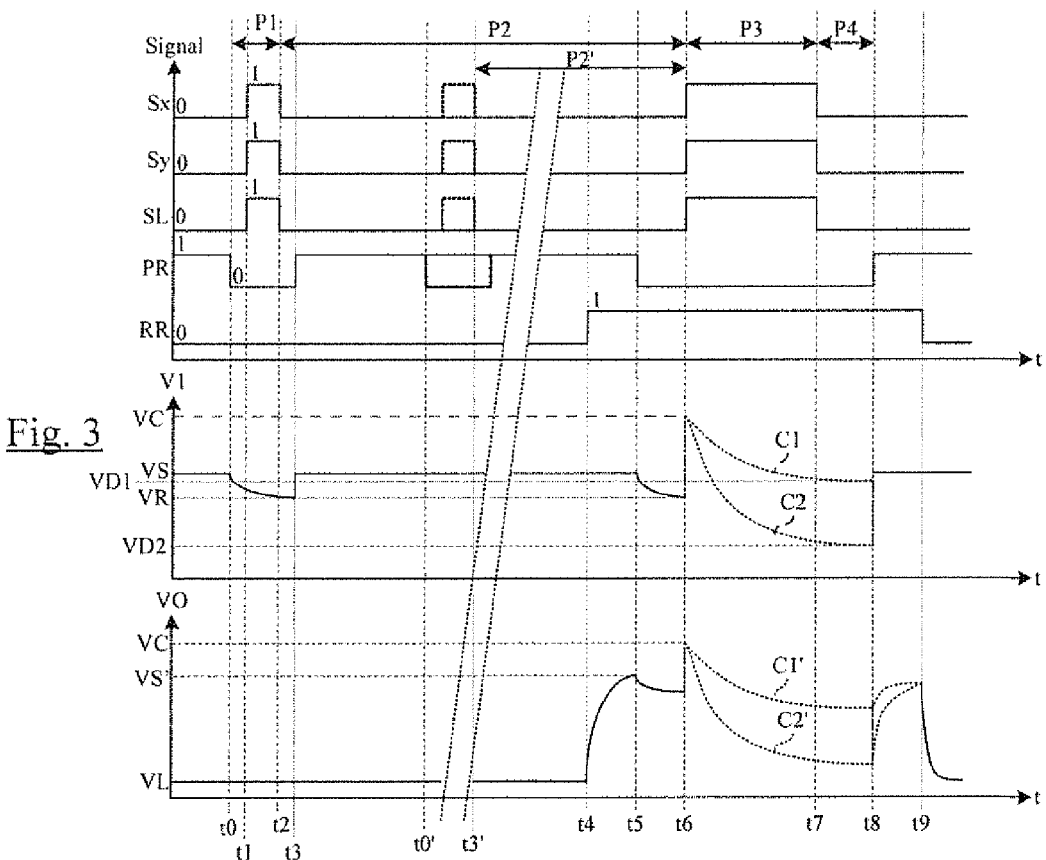
FIG. 3 shows timing diagrams of signals applied to and voltages appearing in the imaging element of FIG. 2 during an image capture cycle.

FIG. 3 shows timing diagrams of signals and voltages of the imaging element U1 of FIG. 2 during an image capture cycle. It is assumed that the imaging element U1 belongs to a row and a column of an array of imaging elements, which together allow an image to be captured. The image capture cycle comprises a reset phase P1, a charge accumulation phase P2, a charge transfer phase P3, and a signal read phase P4.

Before the image capture cycle begins, the imaging element U1 is not selected. The row selection signal Sx and the column selection signal Sy are set to 0, such that the activation signal SL is set to 0, and negative voltage VN1. The transfer transistor TT is thus set in a blocked state, and dark current is prevented or reduced.

The pixel reset signal PR is set to 1, and the reset transistor RT is set in a conducting state, coupling the charge node N1 to the supply voltage VS. Voltage V1 at node N1 is set approximately equal to the supply voltage, for example, +2.5V. The row readout signal RR is set to 0, and the output transistor OT is set in a blocked state. Output voltage VO is at a zero or a low voltage value VL, for example, 0 to +0.2V.

Reset Phase (P1):

At a time t0, the pixel reset signal PR is set to 0, and the reset transistor RT is set in the blocked state. Node N1 is no longer coupled to the supply voltage VS, and voltage V1 at node N1 begins to decrease from the supply voltage VS to a reset voltage VR, for example, +2.4 V.

At a time t1, the row selection signal Sx and the column selection signal Sy are set to 1, and the inverted row and column selection signals /Sx, /Sy (not shown in FIG. 3) are set to 0. The activation signal SL is driven to 1, i.e., positive voltage V21. The transfer transistor TT is set in a conducting state, and the accumulated charges are transferred from the photosensor PS to node N1.

Charge Accumulation Phase (P2):

At a time t2, the signals Sx, Sy are set to 0, and the activation signal SL is set to 0, i.e., negative voltage VN1. The transfer transistor TT is set in the blocked state, and the charge accumulation phase P2 begins.

At a time t3, the pixel reset signal PR is set to 1, and the reset transistor RT is set in the conducting state, coupling node N1 to supply voltage VS to pre-charge voltage V1 at node N1. During this time, the row readout signal RR is held at 0, and the output transistor OT remains in a blocked state. Output voltage VO continues to be at the zero or low voltage value VL. The signals Sx, Sy, SL remain at 0 throughout the charge accumulation period, and transistors T1, T2, TT are held in the blocked state.

At a time t4, the horizontal row comprising the imaging element D1 is selected for read, and the row readout signal RR is set to 1. The output transistor OT is set in a conducting state and couples voltage V1 at node N1 to the output OUT of the imaging element. Output voltage VO rapidly increases to a voltage VS'=VS−Vgs, wherein Vgs is the gate-to-source voltage of the transistor FT.

At a time t5, the pixel reset signal PR is set to 0, and the reset transistor RT is set in the blocked state. Voltage V1 at node N1 begins to drop as before to the reset voltage VR. Voltage VR is sensed by the source-follower transistor FT, and is supplied via the output transistor OT to an image processing system (not shown), which stores this value.

Charge Transfer Phase (P3):

At a time t6, the row selection and the column selection signals Sx and Sy are set to 1, and transistors T1, T2 of the selection circuit S1 are set in the conducting state. The activation signal SL at control node N2 is set to 1. The transfer transistor TT is set in the conducting state, ending the charge accumulation phase. The charges accumulated in the photosensor PS during the charge accumulation phase P2 are transferred to node N1. Voltage V1 at node N1 jumps to a charge voltage VC due to the coupling with the transistor TT.

Two cases are now shown in FIG. 3. If the imaging element U1 did not receive a large amount of light (dark pixel), the charge at node N1 drops slowly, as shown by a curve C1. If, however, the imaging element U1 did receive a large amount of light (bright pixel), the charge at node N1 drops quickly, as shown by a curve C2. The output voltage VO follows voltage V1 at node N1, with a curve C1' corresponding to curve C1, and a curve C2' corresponding to curve C2.

Signal Read Phase (P4):

At a time t7, the transfer of charges from the photosensor PS to node N1 is complete. Signals Sx, Sy are set to 0, and transistors T1, T2 of the selection circuit S1 are set in the blocked state. Transistors T3, T4 are set in the conducting state, and the voltage at node N2 is set to the negative voltage VN1 value, which is applied to the gate of the transfer transistor TT. The transistor TT is set in the blocked state, and dark current is prevented or reduced.

Voltage V1 at node N1 levels off to a signal read voltage VD1 or VD2, corresponding to curve C1 or C2, and output voltage VO also levels off. The source-follower transistor FT senses the signal read voltage and supplies it to the image processing system via the output transistor OT. The difference between the reset voltage VR and the signal read voltage VD1 or VD2 is the voltage value of the imaging element, corresponding to the amount of incident light detected.

At a time t8, the read phase is complete, and the pixel reset signal PR is set to 1. The reset transistor RT is set in the conducting state, and couples node N1 to the supply voltage VS. Voltage V1 at node N1 is precharged to voltage VS. Voltage VO at the output OUT is again set to voltage VS', since the output is coupled to node N1 via the transistor OT in the conducting state.

At a time t9, the row readout signal RR is set to 0, and output transistor OT is set in the blocked state. The output voltage VO drops back down to the zero or low voltage. A new image capture phase can begin.

The charge accumulation period P2 may be adjusted as needed using the imaging element U1. For example, at a time t0', the pixel reset signal PR is set to 0, and then the selection signals Sx, Sy are pulsed to 1. A new charge accumulation period P2' begins at time t3', when the selection signals Sx, Sy return to 0.

Though only two integration periods P2, P2' are shown in FIG. 3, a larger number of integration periods with different lengths of time may be achieved by pulsing the selection signals and the reset signal. Generally, the length of integration period required for each pixel is calculated beforehand. Ideally, eight or more different integration times are provided, increasing the dynamic of the image sensor and its signal-to-noise ratio.

As understood by those skilled in the art, one of the signals Sx or Sy may be held at logic 1 during the entire image capture process, whereas the other signal Sy or Sx is set to 1 only when it is desired to adjust the integration period of the pixel. Similarly, the reset signal may be set to 0 at regular intervals to coincide with pulses of the selection signals during the charge accumulation phase.

Figure 4:
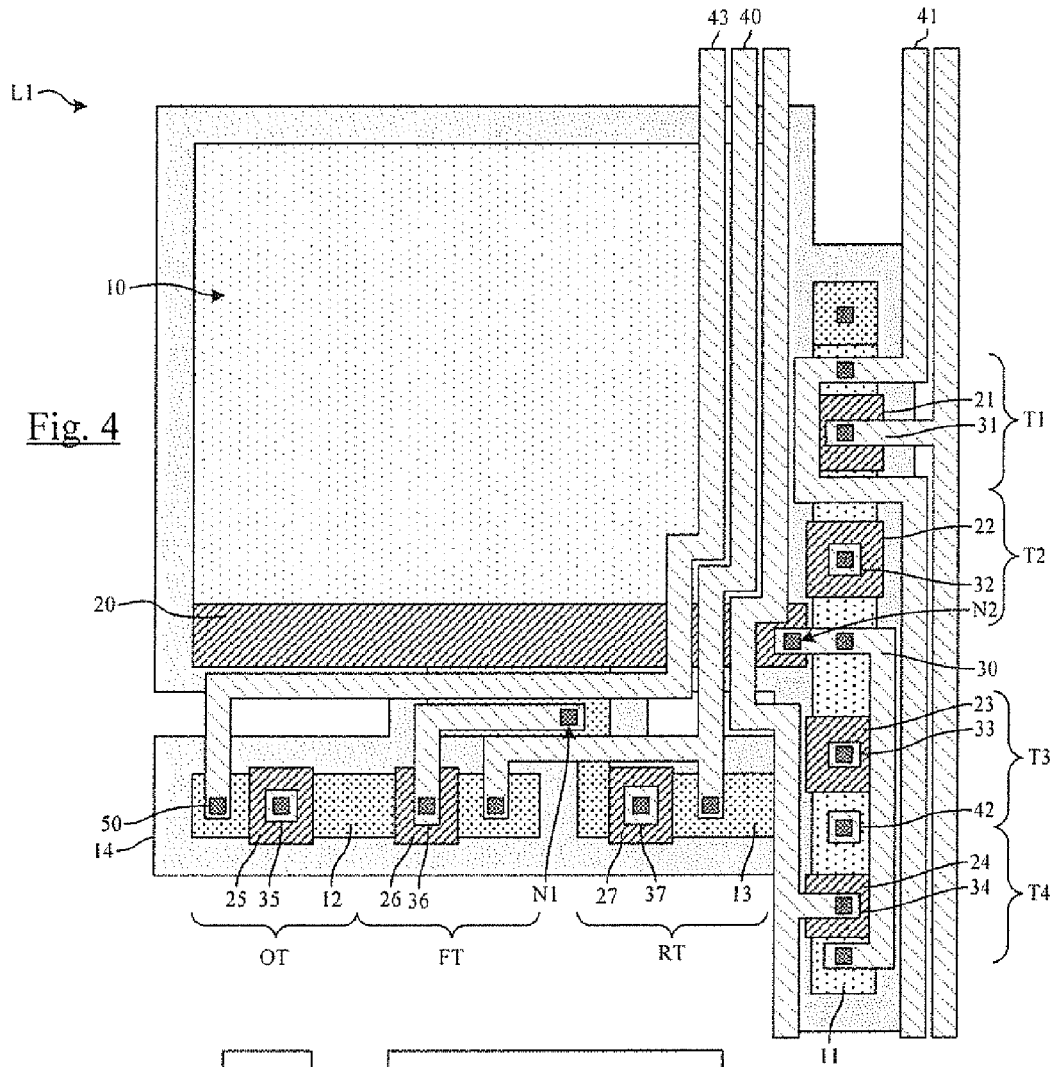
FIG. 4 shows a semiconductor topography of the imaging element of FIG. 2.

FIG. 4 shows a semiconductor topography layout L1 of t and will be noted by imaging element U1 of FIG. 2, according to one embodiment. Layout L1 comprises a photosensitive area 10, an n-doped well 11, p-doped wells 12, 13, a deep trench isolation 14, polysilicon polygons 20 to 27, metal polygons 30 to 37, metal tracks 40 to 43, and a plurality of interconnection polygons 50.

Photosensitive area 10 has the form of a large square. The n-well 11 is formed to the right of photosensitive area 10, and the p-wells 12, 13 are formed below photosensitive area 10. The deep trench isolation 14 surrounds the photosensitive area 10, the n-well 11, and the p-wells 12, 13. The n-well 11 forms the drains and sources of the PMOS transistors T1 to T4. The p-well 12 forms the drains and sources of the transistors FT, OT, and the p-well 13 forms the drain and source of the reset transistor RT and the charge node N1.

The polysilicon polygon 20 forms the gate of the transfer transistor TT, and extends along the bottom of the photosensitive area 10. The polysilicon polygons 21 to 24 are formed over the n-well 11 and form the gates of the transistors T1 to T4 respectively. The polysilicon polygons 25 to 27 are formed over the p-wells 12, 13 and form the gates of the transistors OT, FT, RT, respectively.

A metal polygon 30 is coupled to the drains D of the transistors T2, T3, T4 formed in the n-well 11, and to one end of the polysilicon polygon 20, forming the node N2. The metal polygons 31 to 34 supply the signals /Sx, /Sy, Sx, Sy to the transistors T1 to T4, respectively. The metal polygons 35, 37 supply the signals RR, PR to the transistors OT, RT. The metal polygon 36 is coupled on one end to the gate of the transistor FT formed by the polysilicon polygon 26, and one end to the p-well 13, forming node N1. Each metal polygon 31 to 37 is coupled to corresponding polysilicon polygons 21 to 27.

The metal tracks 40 to 43 extend along the right side of the photosensitive area 10. Metal track 40 supplies supply voltage VS to the drains D of the transistors FT, RT formed in the p-wells 12, 13. Metal track 41 supplies positive voltage VP1 to the drain of the transistor T1 formed in the n-well 11, and metal track 42 supplies negative voltage VN1 to the sources of transistors T3, T4 formed in the n-well 11. Metal track 43 is coupled to the source of the transistor OT and supplies the output voltage VO. Finally, interconnection polygons 50 form the interconnections and vias between wells, polysilicon polygons, and metal polygons.

The diffusion of the n-well 11 is contained by the deep trench isolation 14. Thus, the area required for the n-well 11 is limited to the size of the transistors T1 to T4. The surface area occupied by the selection circuit S1 is therefore relatively small with respect to the photosensitive area 10. The deep trench isolation 14 generally extends about 4 microns or more into the substrate, deeper than the n- and p-well dopings.

Figure 5:
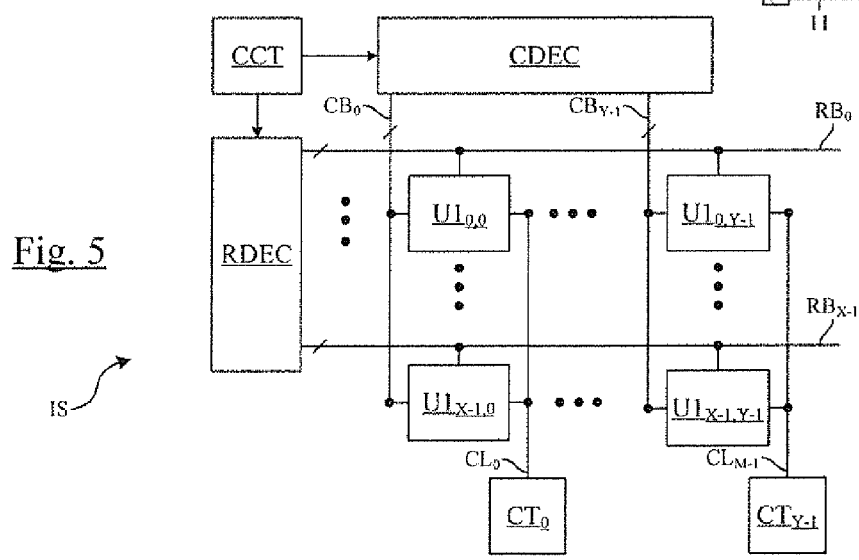
FIG. 5 shows an image sensor comprising imaging elements according to the invention.

FIG. 5 shows an image sensor IS according to another embodiment. The image sensor IS comprises an array which comprises: X*Y imaging elements $U1_{x,y}$ ($U1_{0,0}$ to $U1_{X-1,Y-1}$) arranged in X horizontal rows and Y vertical columns, X row buses RBx ($RB_0$ to $RB_{X-1}$), Y column buses CBx ($CB_0$ to $CB_{Y-1}$), and Y column readout lines CLy ($CL_0$ to $CL_{Y-1}$). Each imaging element is connected on input to a row bus RBx and to a column bus CBy, and on output to a column line CLy. For the sake of simplicity, the connections to supply voltage VS, positive voltage VP1, and negative voltage VN1 are not shown. The image sensor IS further comprises a control circuit CCT, a row decoder RDEC, a column decoder CDEC, and Y column readout circuits CTy.

All imaging elements of a horizontal row are connected to a row bus RBx, which supplies the pixel reset signal PR, the row readout signal RR, the row selection signal Sx, and the inverted row selection signal /Sx for the row. Row decoder RDEC is connected to each row bus RBx, and comprises means or circuitry for inverting the row selection signal Sx to obtain the inverted row selection signal /Sx.

All imaging elements of a same vertical column are connected to same column bus CBy and column readout line CLy. Column bus CBy supplies the column selection signal Sy and the inverted column selection signal /Sy. The column decoder CDEC is connected to each column bus CBy, and comprises means or circuitry for inverting the column selection signal Sy to obtain the signal /Sy. Each column line CLy is connected to a corresponding column readout circuit CTy. The control circuit COT is coupled to the row decoder RDEC and the column decoder CDEC.

The control circuit CCT is linked to the row decoder RDEC and to the column decoder CDEC. Depending on commands sent by the control circuit, the decoders RDEC, CDEC supply row and column selection signals on the row and column buses to the individual control imaging elements $U1_{x,y}$ during an image capture cycle.

Figure 6:
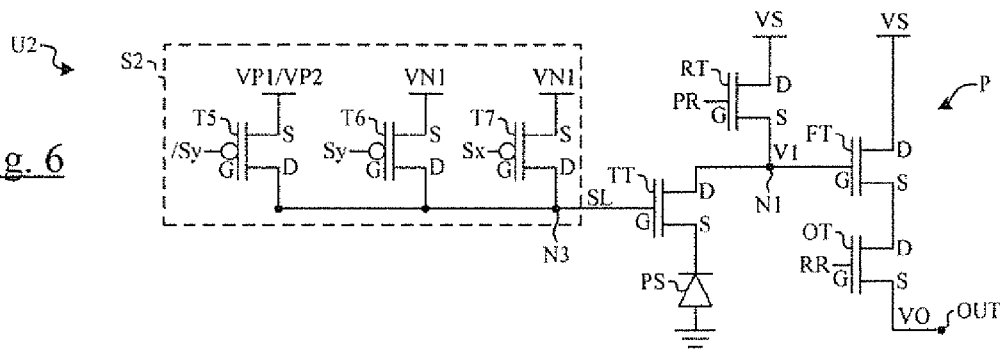
FIG. 6 shows an imaging element according to another embodiment of the invention.

FIG. 6 shows an imaging element U2 according to another embodiment. The imaging element U2 comprises a pixel P, as described previously in relation with FIG. 2, and a selection circuit 52. The selection circuit S2 has a control node N3 connected to the gate G of the transfer transistor TT of the pixel.

The selection circuit S2 comprises three P-type MOS (PMOS) transistors T5, T6, T7. Transistor T5 has a source S receiving positive voltages VP1, VP2, a gate G driven by an inverse column selection signal /Sy, and a drain D connected to a control node N3. Transistors T6, T7 are connected in parallel, and their sources S receive a negative voltage VN1, their drains D are connected to node N3, and their gates G are driven by a column selection signal Sy and a row selection signal Sx, respectively. Control node N3 is connected to the gate G of the transfer transistor TT of the pixel P. The activation signal SL is applied to the gate of the transfer transistor TT, and may have the positive voltage VP1 or negative voltage VN1 values.

TABLE 2A below shows example voltage values of the selection signals Sx, Sy, /Sy, SL corresponding to a logic 0 and a logic 1. TABLE 2B shows the truth table for the possible logic combinations of the row and column selection signals.

TABLE 2A

| | Sx | Sy | /Sy | SL |
|---|---|---|---|---|
| 0 | VN2 | VN2 | VP2 | VN1 |
| 1 | VP1 | VP1 | VP1 | VP1 |

TABLE 2B

| Sx | Sy | /Sy | SL | SL (Voltage) |
|---|---|---|---|---|
| 0 | 0 | 1 | 0 | VN1 |
| 0 | 1 | 0 | 0 | VN1 |
| 1 | 0 | 1 | 0 | VN1 |
| 1 | 1 | 0 | 1 | VP1 |

It should be noted in TABLE 2A that the voltages of the signals Sy, /Sy are not the same. Signal /Sy has two positive voltage values, for example, a lower voltage value VP2=+1.0V and a higher voltage value VP1=+3.3V. Furthermore, the voltage applied on the source S of transistor T5 varies according to the value of signal Sx. That is, when Sx=0, voltage VP2 is applied, and when Sx=1, voltage VP1 is applied.

When the column selection signal Sy is set to logic 0, no matter what the value of the row selection signal Sx, the control node N3 is coupled to negative voltage VN1. The activation signal SL is therefore set to logic 0, and the imaging element U2 is set in the non-selected state. The transfer transistor TT receives negative voltage VN1 on its gate G and is set in the blocked state.

When the row selection Sx signal is set and the column selection signal Sy is set to 1, the inverted signal /Sy is set to 0. Transistor T5 receives voltage VP2 on its source and gate terminals. As the source and gate voltages across the transistor T are equal, transistor T5 is in the cut-off region. As a result, no current flows through the transistor T5. Transistor T7 couples control node N3 to negative voltage VN1. The activation signal SL is set to 0, voltage VN1, and the transfer transistor TT is set in the blocked state.

When the row selection Sx and the column selection Sy signals are set to 1, the inverted signal /Sy is set to 0. Transistor T5 is set in the conducting state, and transistors T6, T7 are set in the blocked state. Transistor T5 couples control node N3 to positive voltage VP1, whereas transistors T6, T7 prevent negative voltage VN1 from being supplied to the control node N3. The activation signal SL is set to logic 1, and the imaging element U2 is set in the selected state. The transfer transistor TT receives positive voltage VP1 on its gate G and is set in the conducting state.

As before, positive voltage VP1 is only applied to the gate of the transfer transistor TT when both the row selection signal Sx and the column selection signal Sy are at 1. Otherwise, negative voltage VN1 is supplied to the gate of the transfer transistor TT, keeping it set in a blocked state and preventing dark current. As a result, the imaging element is only selected, i.e., the transfer transistor TT is set in the conducting state, when its corresponding row and column are selected.

Figure 7:
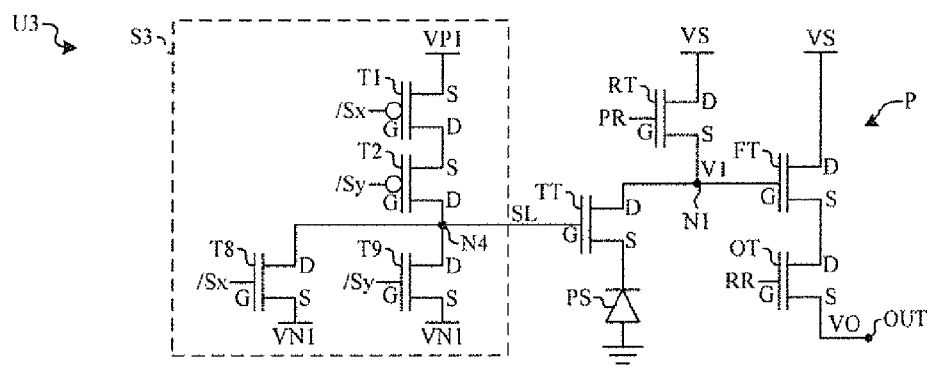
FIG. 7 shows an imaging element according to another embodiment of the invention.

FIG. 7 shows an imaging element U3 according to another embodiment. The element U3 comprises a pixel P, as described previously in relation with FIG. 2, and a selection circuit S3. The selection circuit S3 has a control node N4 connected to the gate G of the transfer transistor TT of the pixel.

The selection circuit S3 comprises two P-type MOS (PMOS) transistors T1, T2, and two N-type MOS (NMOS) transistors T8, T9. Transistors T1, T2 are connected in series, and transistors T8, T9 are connected in parallel. Transistor T1 has a source S receiving a positive voltage VP1, a gate G driven by the inverted row selection signal /Sx, and a drain D connected to a source S of transistor T2. Transistor T2 has a gate G driven by the inverted column selection signal /Sy, and a drain D connected to node N4. Transistors T8, T9 each have a source S connected to a negative voltage supply VN1, a drain D connected to node N4, and a gate driven by the inverted row selection signal /Sx, and the column selection signal /Sy respectively.

TABLES 3A, 3B below show example voltage values of the signals /Sx, /Sy, SL corresponding to logic 0 and logic 1, and the truth table for the possible logic combinations of the inverted row and column selection signals.

TABLE 3A

| | /Sx | /Sy | SL |
|---|---|---|---|
| 0 | VN2 | VN2 | VN1 |
| 1 | VP1 | VP1 | VP1 |

TABLE 3B

| /Sx | /Sy | SL | SL (Voltage) |
|---|---|---|---|
| 1 | 1 | 0 | VN1 |
| 1 | 0 | 0 | VN1 |
| 0 | 1 | 0 | VN1 |
| 0 | 0 | 1 | VP1 |

As before, positive voltage VP1 is only applied to the gate of the transfer transistor TT when both the row selection signal Sx and the column selection signal Sy are at a logic 1, corresponding to the inverted row selection signal /Sx and the inverted column selection signal /Sy at a logic 0. Otherwise, negative voltage VN1 is supplied to the gate of the transfer transistor TT, keeping it set in a blocked state and preventing dark current.

Figure 8:
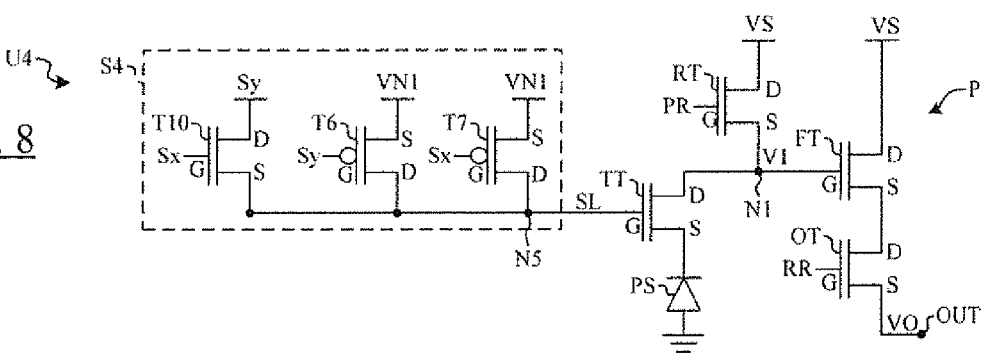
FIG. 8 shows an imaging element according to another embodiment of the invention.

FIG. 8 shows an imaging element U4 according to another embodiment. The imaging element U4 comprises a pixel P as described previously, and a pixel selection circuit S4. The selection circuit S4 has a control node N5 supplying the activation signal SL to gate G of the transfer transistor TT of the pixel.

The selection circuit S4 comprises two P-type MOS (PMOS) transistors T6, T7, and a single N-type MOS (NMOS) transistor T10. Transistors T6, T7 are connected in parallel with their sources S receiving negative voltage VN1, their drains D connected to control node N5, and their gates G driven by the row selection and the column selection signals Sx, Sy respectively. Transistor T10 comprises a drain D receiving the column selection signal Sy, a source S connected to node N5, and a gate G driven by the row selection signal Sx. Advantageously, this embodiment provides that transfer transistor TT is not in a floating state when transistor T10 is in the blocked state.

TABLES 4A, 4B below show example voltage values corresponding to logic 0 and logic 1 of the signals Sx, Sy, SL, and the truth table for the possible logic combinations of the inverted row and column selection signals.

TABLE 4A

|  | Sx | Sy | SL |
|---|---|---|---|
| 0 | VN2 | VN2 | VN1 |
| 1 | VP1 | VP1 | VP1 |

TABLE 4B

| Sx | Sy | SL | SL (Voltage) |
|---|---|---|---|
| 0 | 0 | 0 | VN1 |
| 0 | 1 | 0 | VN1 |
| 1 | 0 | 0 | VN1 |
| 1 | 1 | 1 | VP1 |

As before, the activation signal SL has a positive voltage VP1 value and is applied to the gate of the transfer transistor TT only when both the row selection signal Sx and the column selection signal Sy are at 1. Otherwise, the activation signal SL has the negative voltage VN1 value and is applied to the gate G of the transfer transistor TT, keeping it set in a blocked state and preventing or reducing dark current.

Figure 9:
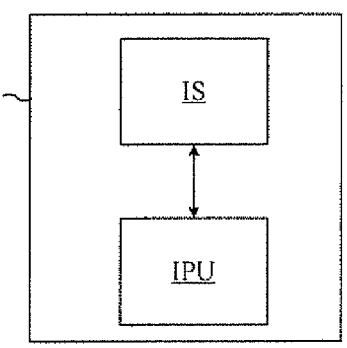
FIG. 9 shows a device comprising an image sensor according to the invention.

FIG. 9 shows an electronic device DV comprising an image sensor IS and an image processing element IPU. The image processing element IPU is able to process images supplied by the image sensor IS. Based on one or more images, the image processing element IPU may adjust the integration periods of the imaging elements of the image sensor.

For example, after a first image is captured, the image processing element IPU can analyze the image to determine whether there is a large contrast between light and dark areas of the image. Based on this analysis, the image processing element IPU may send a control signals to the image sensor IS. The image sensor IS then applies the row and column selection signals accordingly, to adjust the integration period of one or more pixels for optimum imaging. The device DV may further comprise a memory to store integration period information relating to one or more pixels, for processing the light information supplied by the elements after modification of their integration periods.

It is to be understood by those skilled in the art that the pixels of the present invention are not limited to the four transistor 4T structure as shown in FIGS. 2, 5. Different pixel architectures are known, and all generally comprise a photosensitive area and a charge storage node. For example, the five transistor 5T structure, six transistor 6T structure, etc. may be used. Furthermore, the transistors used for the reset, source-follower, and output transistors may be p-type MOS PMOS transistor instead of NMOS transistors. For example, a PMOS source-follower transistor FT allows better noise reduction, and a PMOS reset transistor RT allows a better dynamic of the image sensor. In this case, the signals, layout, etc. are adapted accordingly.

Furthermore, the circuitry for inverting the row and/or column selection signals /Sx, /Sy may be supplied within each imaging element, or may be supplied for an entire row or column, for example, within the row decoder RDEC or the column decoder CDEC.

That which is claimed is:

1. An imaging element comprising:
a photosensor;
a transfer transistor coupled to said photosensor and configured to transfer an electrical charge from said photosensor to a charge accumulation node, said transfer transistor comprising a control terminal; and
a selector configured to
receive at least two selection signals, each selection signal having a first voltage polarity when at a first logic value and a second voltage polarity when at a second logic value, and
supply an activation signal having the second voltage polarity when the imaging element is not selected, which is a function of the at least two selection signals, to the control terminal of said transfer transistor, said selector comprising at least two transistors receiving the at least two selection signal.

2. The imaging element according to claim 1, wherein the at least two selection signals comprise first and second selection signals, and first and second inverted selection signals; and wherein said at least two transistors of said selector only comprises four P-type MOS transistors and configured to
receive the first and second selection signals having the first and second voltage polarities according to their logic values; and
receive the first and second inverted selection signals having the first and second voltage polarities according to their logic values.

3. The imaging element according to claim 1, wherein the at least two selection signals comprise first and second selection signals, and a first inverted selection signal; and wherein said at least two transistors of said selector only comprises three P-type MOS transistors and configured to receive the first and second selection signals having the first and second voltage polarities according to their logic values; and receive the first inverted selection signal having a low voltage value and a high voltage value according to its logic value.

4. The imaging element according to claim 1, wherein the at least two selection signals comprise first and second inverted selection signals; and wherein said at least two transistors of said selector only comprises two P-type MOS transistors and two N-type MOS transistors and configured to receive the first and second inverted selection signals having the first and second voltage polarities according to their logic values.

5. The imaging element according to claim 1, wherein the at least two selection signals comprise first and second selection signals; and wherein said at least two transistors of said selector only comprises two P-type MOS transistors and one N-type MOS transistor and configured to receive the first and second selection signals having the first and second voltage polarities according to their logic values.

6. An image sensor device comprising:
a plurality of imaging elements arranged in horizontal rows and vertical columns, each imaging element comprising
 a photosensor,
 a transfer transistor coupled to said photosensor and configured to transfer an electrical charge from said photosensor to a charge accumulation node, said transfer transistor comprising a control terminal, and
 a selector configured to receive at least two selection signals, and to supply an activation signal having a second voltage polarity when the imaging element is not selected, which is a function of the at least two selection signals, to the control terminal of said transfer transistor, and said selector comprising at least two transistors receiving the at least two selection signal;
a row decoder coupled to each horizontal row of imaging elements and configured to supply at least one selection signal having a first voltage polarity when at a first logic value and the second voltage polarity when at a second logic value to said selector; and
a column decoder coupled to each vertical column of imaging elements and configured to supply at least one selection signal having the first voltage polarity when at the first logic value and the second voltage polarity when at the second logic value to said selector.

7. The image sensor device according to claim 6, wherein the at least two selection signals comprise first and second selection signals, and first and second inverted selection signals; wherein said at least two transistors of said selector only comprises four P-type MOS transistors; and wherein said row and column decoders are configured to
supply the first and second selection signals having the first and second voltage polarities according to their logic values; and
supply the first and second inverted selection signals having the first and second voltage polarities according to their logic values.

8. The image sensor device according to claim 6, wherein the at least two selection signals comprise first and second selection signals, and a first inverted selection signal; wherein said at least two transistors of said selector only comprises three P-type MOS transistors; and wherein said row and column decoders are configured to
supply the first and second selection signals having the first and second voltage polarities according to their logic values; and
supply the first inverted selection signal having a low voltage value and a high voltage value according to its logic value.

9. The image sensor device according to claim 6, wherein the at least two selection signals comprise first and second inverted selection signals; wherein said at least two transistors of said selector only comprises two P-type MOS transistors and two N-type MOS transistors; and wherein said row and column decoders are configured to supply the first and second inverted selection signals having the first and second voltage polarities according to their logic values.

10. The image sensor device according to claim 6, wherein the at least two selection signals comprise first and second selection signals; wherein said at least two transistors of said selector only comprises two P-type MOS transistors and one N-type MOS transistor; and wherein said row and column decoders are configured to supply the first and second selection signals having the first and second voltage polarities according to their logic values.

11. A method of controlling an imaging element comprising a photosensor, a transfer transistor coupled to the photosensor and configured to transfer an electrical charge from the photosensor to a charge accumulation node, with the transfer transistor comprising a control terminal, and a selector, the method comprising:
providing to the selector at least two selection signals, each selection signal having a first voltage polarity when at a first logic value and a second voltage polarity when at a second logic value, the selector comprising at least two transistors receiving the at least two selection signal, and
operating the selector to provide an activation signal having the second voltage polarity when the imaging element is not selected, which is a function of the at least two selection signals, to the control terminal of the transfer transistor.

12. The method according to claim 11, wherein the at least two selection signals comprise first and second selection signals and first and second inverted selection signals; wherein the at least two transistors of the selector only comprises four P-type MOS transistors; and wherein providing to the selector the at least two selection signals comprises:
providing the first and second selection signals having the first and second voltage polarities according to their logic values; and
providing the first and second inverted selection signals having the first and second voltage polarities according to their logic values.

13. The method according to claim 11, wherein the at least two selection signals comprise first and second selection signals, and a first inverted selection signal; wherein the at least two transistors of the selector only comprises three P-type MOS transistors; and wherein providing to the selector the at least two selection signals comprises:
providing the first and second selection signals having the first and second voltage polarities according to their logic values; and
providing the first inverted selection signal having a low voltage value and a high voltage value according to its logic value.

14. The method according to claim 11, wherein the at least two selection signals comprise first and second inverted selection signals; and wherein the at least two transistors of the selector only comprises two P-type MOS transistors and two N-type MOS transistors; and wherein providing to the selector the at least two selection signals comprises providing the first and second inverted selection signals having the first and second voltage polarities according to their logic values.

15. The method according to claim 11, wherein the at least two selection signals comprise first and second selection signals; and wherein the at least two transistors of the selector only comprises two P-type MOS transistors and one N-type MOS transistor; and wherein providing to the selector the at least two selection signals comprises providing the first and second selection signals having the first and second voltage polarities according to their logic values.

\* \* \* \* \*